(12) United States Patent  
Woodruff

(10) Patent No.: US 8,562,752 B2
(45) Date of Patent: Oct. 22, 2013

(54) SINGLE WORKPIECE PROCESSING CHAMBER

(75) Inventor: Daniel J. Woodruff, Kalispell, MT (US)

(73) Assignee: APPLIED Materials, Inc., Santa Clara, CA (US)

(\*) Notice: Subject to any disclaimer, the term of this patent is extended or adjusted under 35 U.S.C. 154(b) by 0 days.

(21) Appl. No.: 13/299,141

(22) Filed: Nov. 17, 2011

(65) Prior Publication Data

US 2012/0060869 A1   Mar. 15, 2012

Related U.S. Application Data

(62) Division of application No. 11/075,099, filed on Mar. 8, 2005, now Pat. No. 8,118,044.

(60) Provisional application No. 60/552,642, filed on Mar. 12, 2004.

(51) Int. Cl.
| | |
|---|---|
| *B08B 7/04* | (2006.01) |
| *B08B 5/04* | (2006.01) |
| *B08B 3/00* | (2006.01) |
| *B08B 1/02* | (2006.01) |
| *B08B 7/00* | (2006.01) |
| *B08B 3/14* | (2006.01) |
| *B08B 3/12* | (2006.01) |
| *B08B 6/00* | (2006.01) |

(52) U.S. Cl.
USPC .................. 134/32; 134/10; 134/21; 134/26; 134/33; 134/34; 134/42; 134/117; 134/120; 134/133; 134/183; 134/201; 134/902

(58) Field of Classification Search
USPC .............. 134/10, 21, 26, 32, 33, 34, 42, 117, 134/120, 133, 183, 201, 902
See application file for complete search history.

(56) References Cited

U.S. PATENT DOCUMENTS

| | | | |
|---|---|---|---|
| 5,658,387 A |   | 8/1997 | Reardon et al. |
| 5,975,097 A |   | 11/1999 | Yonemizu et al. |
| 5,980,706 A | * | 11/1999 | Bleck et al. ............... 204/297.14 |
| 6,079,428 A | * | 6/2000 | Anai .............................. 134/172 |

(Continued)

FOREIGN PATENT DOCUMENTS

| | | |
|---|---|---|
| JP | 10077095 A | 3/1998 |
| JP | 11251211 A | 9/1999 |
| JP | 2003168673 A | 6/2003 |
| JP | 2003251255 A | 9/2003 |

OTHER PUBLICATIONS

PCT International Seach Report for International Application No. PCT/US2005/008066 mailed Jun. 21, 2005.

(Continued)

*Primary Examiner* — Joseph L Perrin
*Assistant Examiner* — Charles W Kling
(74) *Attorney, Agent, or Firm* — Kenneth H. Ohriner; Perkins Coie LLP

(57) ABSTRACT

A process chamber for processing semi-conductor wafers. The chamber includes at least one rotor within the process chamber. The rotor is adapted to receive and/or process semi-conductor wafers. The top of the process chamber also includes a tiltable rim. This rim tilts from a non-inclined position to an inclined position. The wafers may be loaded into and unloaded from the process chamber when the rim is in its inclined position.

12 Claims, 12 Drawing Sheets

(56) References Cited

U.S. PATENT DOCUMENTS

| | | |
|---|---|---|
| 6,247,479 B1 * | 6/2001 | Taniyama et al. ............ 134/95.2 |
| 6,383,331 B1 * | 5/2002 | Sumnitsch ................ 156/345.1 |
| 6,623,609 B2 | 9/2003 | Harris et al. |
| 6,754,980 B2 | 6/2004 | Lauerhaas et al. |
| 6,900,132 B2 | 5/2005 | Thompson et al. |
| 6,930,046 B2 | 8/2005 | Hanson et al. |
| 7,119,438 B2 | 10/2006 | Hazeyama et al. |
| 7,198,694 B2 | 4/2007 | Woodruff et al. |
| 7,313,462 B2 | 12/2007 | Woodruff et al. |
| 7,337,663 B2 | 3/2008 | Wirth et al. |
| 7,371,306 B2 | 5/2008 | Davis et al. |
| 7,393,439 B2 | 7/2008 | McHugh et al. |
| 2002/0096200 A1 | 7/2002 | Pascal et al. |
| 2002/0185152 A1 * | 12/2002 | Lauerhaas et al. ............ 134/1.3 |
| 2004/0013797 A1 | 1/2004 | Thompson et al. |
| 2005/0178402 A1 | 8/2005 | Stowell et al. |

OTHER PUBLICATIONS

PCT Written Opinion of the International Searching Authority for International Application No. PCT/US2005/008066 mailed Jun. 21, 2005.

JP Office Action dated Dec. 25, 2009 in JP Patent Application No. JP2007-503035.

Taiwan Intellectual Property Office, Translation of Office Action for TW 094107037, dated Dec. 12, 2011.

* cited by examiner

SINGLE WORKPIECE PROCESSING CHAMBER

CROSS-REFERENCE TO RELATED APPLICATIONS

This Application is a Division of U.S. patent application Ser. No. 11/075,099 filed Mar. 8, 2005, now U.S. Pat. No. 8,118,044, and which claims priority to U.S. Patent Application No. 60/552,642, filed Mar. 4, 2004, both incorporated herein by reference.

BACKGROUND OF THE INVENTION

This invention relates to surface preparation, cleaning, rinsing and drying of workpieces, such as semiconductor wafers, flat panel displays, rigid disk or optical media, thin film heads or other workpieces formed from a substrate on which microelectronic circuits, data storage elements or layers, or micro-mechanical elements may be formed. These and other similar articles are collectively referred to as a "wafer" or "workpiece." Specifically, this invention relates to a workpiece process chamber for treating a semiconductor wafer, and more particularly to a novel process chamber for loading and processing a semiconductor wafer. The invention also relates to a new method for treating a semiconductor wafer.

SUMMARY OF THE INVENTION

This invention is a system for processing a semi-conductor wafer. The system may include a number of process chambers. At least one of these process chambers is a novel process chamber. The invention is also a method for treating a semi-conductor wafer with that novel process chamber.

The use of a tiltable rim in connection with a process chamber simplifies the construction of the process chamber, and should thus lead to a more reliable, lower-maintenance process chamber. The use of the tiltable rim also permits a variety of processing steps to be done within a single process chamber. Particularly, the Use of the tiltable rim permits the insertion of a wafer with the first side, i.e., the side that is intended to be processed, facing up. The tiltable rim also permits three processing operations to be performed in a single process chamber. For example, up to two or more processing steps may be performed in an upper compartment of the process chamber, and one or more processing steps may be performed in a lower compartment of the process chamber. The use of a tiltable rim, especially in conjunction with its built-in channels, also helps to keep the semi-conductor wafers, and the robot end effector that inserts and removes those wafers, clean during wafer processing. This will in turn reduce the likelihood of damaging the resulting microelectronic devices.

The use of a pivoting arm or swing arm in conjunction with the tiltable rim has additional beneficial effects. Typically, the pivoting arm moves from a second position to a first position in a sweeping motion, across the face of the spinning wafer, so that fluid being discharged from the pivoting arm impinges upon and contacts virtually the entire surface of the wafer.

DETAILED DESCRIPTION

The invention is a system for processing a semi-conductor wafer, a novel process chamber that is a part of that system, and a novel method of processing a semi-conductor wafer, preferably using that novel process chamber.

Figure 1:
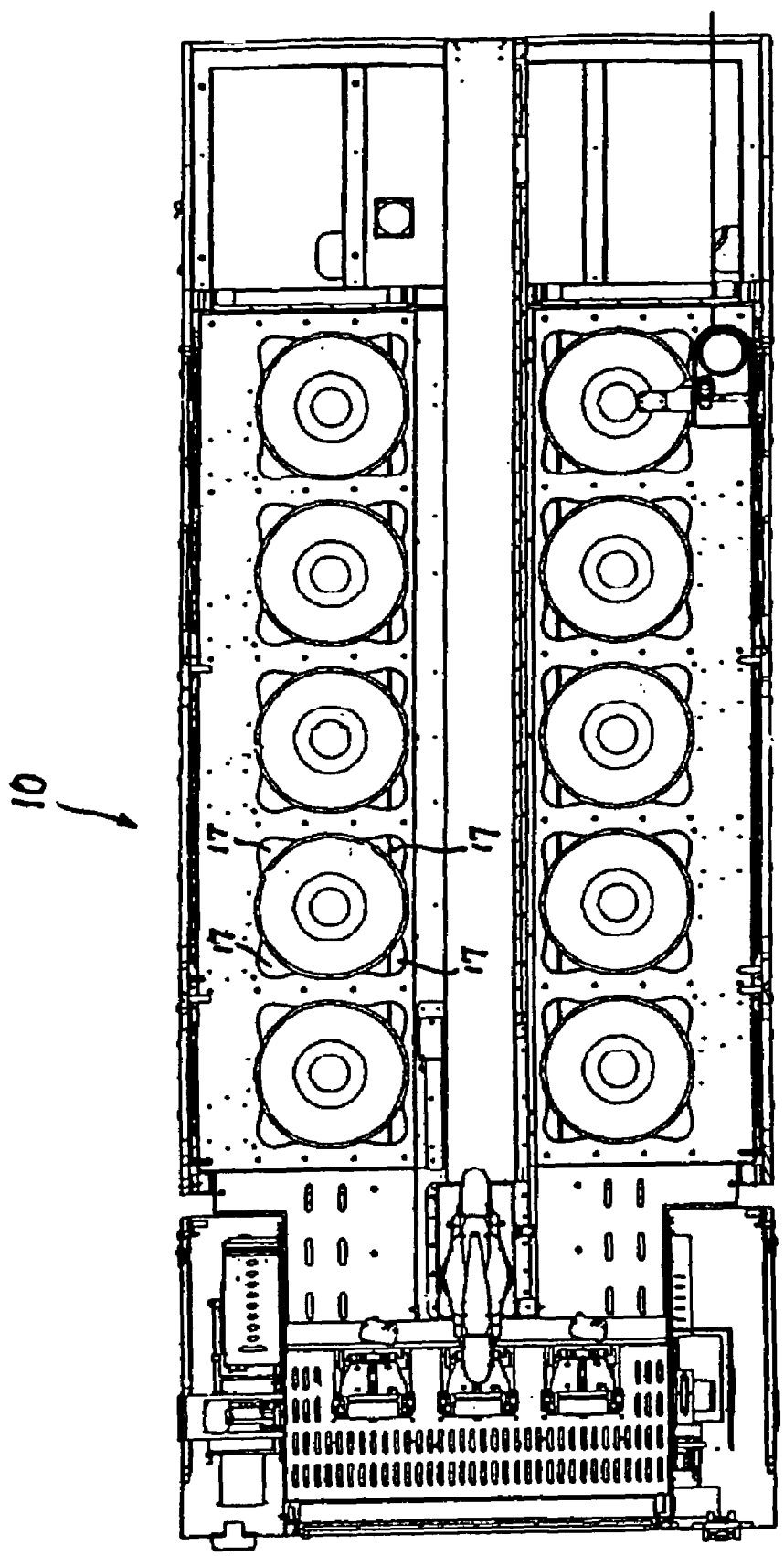
FIG. 1 is a top plan view of a system for processing a single workpiece, such as a semi-conductor wafer, in accordance with an embodiment of the invention.

FIG. 1 shows a top plan view of the system 10 of the invention. The system 10 shown in FIG. 1 includes ten process chambers, each of which is represented in FIG. 1 by a circle. It will be understood that the system 10 may include a greater or lesser number of process chambers. The process chambers may be configured to process microelectronic workpieces, such as 200 or 300 mm diameter semiconductor wafers. The process chamber of the present invention is designed to be utilized in a conventional existing processing system 10, for example, as disclosed in pending U.S. Pat. Nos. 6,900,132 and 6,930,046, both incorporated herein by reference. This-system 10 may include different process stations or chambers, such as but not limited to those that perform electroless plating and electroplating. More particularly, these chambers serve as a means for plating and otherwise processing microelectronic workpieces. These systems may also be modularized, and thus may be readily expanded.

Figure 1A:
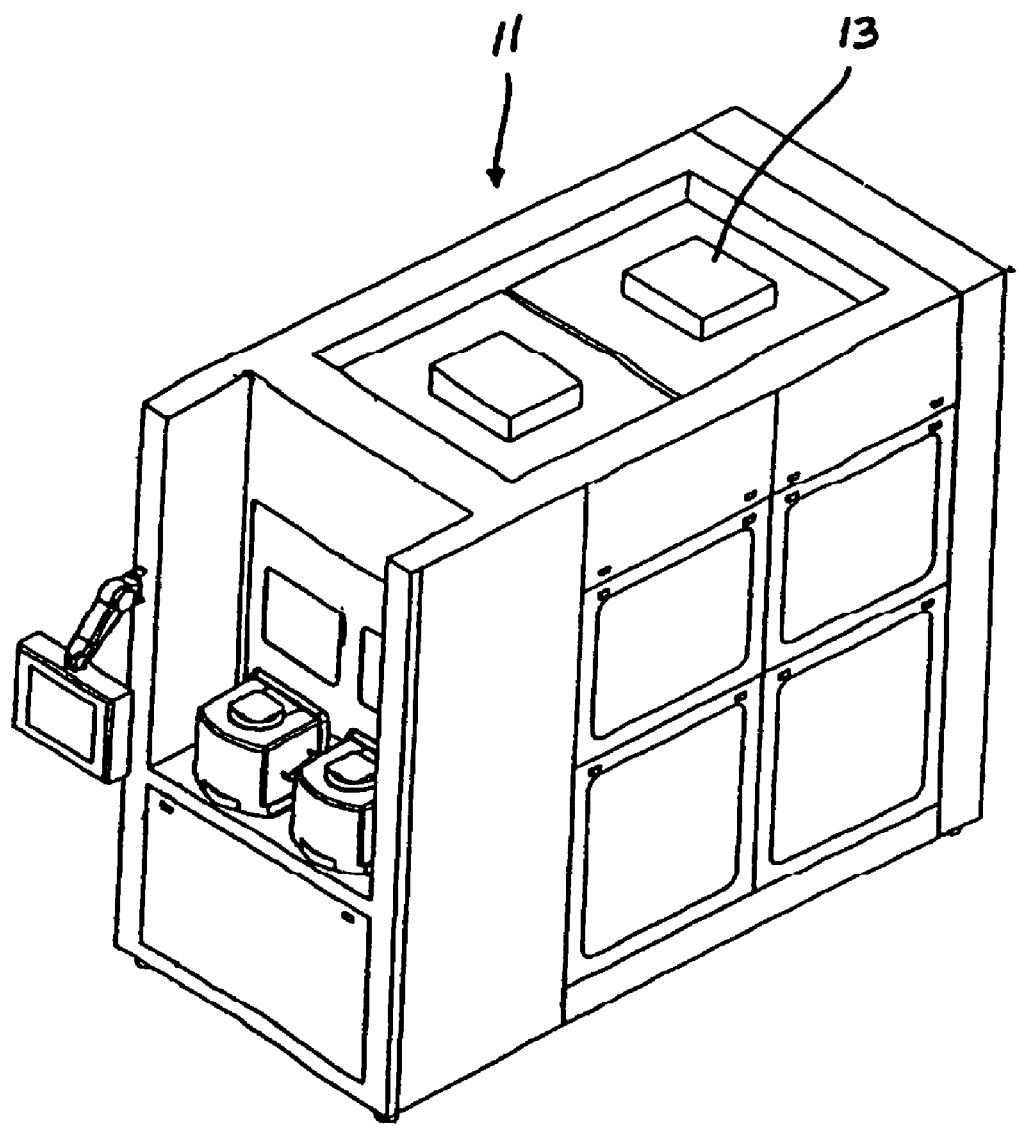
FIG. 1A is a perspective view of a portion of the processing system of FIG. 1.

FIG. 1A shows the enclosure 11 in which the process chambers of the invention are enclosed. The top of this enclosure 11 includes a HEPA filter 13. Air is drawn into the enclosure 11 through this HEPA filter 13. After entering the enclosure 11 through this HEPA filter 13, the air passes through the process chambers 12 of the invention, and is then drawn out through exhaust ducts connected to the bottom of the enclosure 11.

Figure 1B:
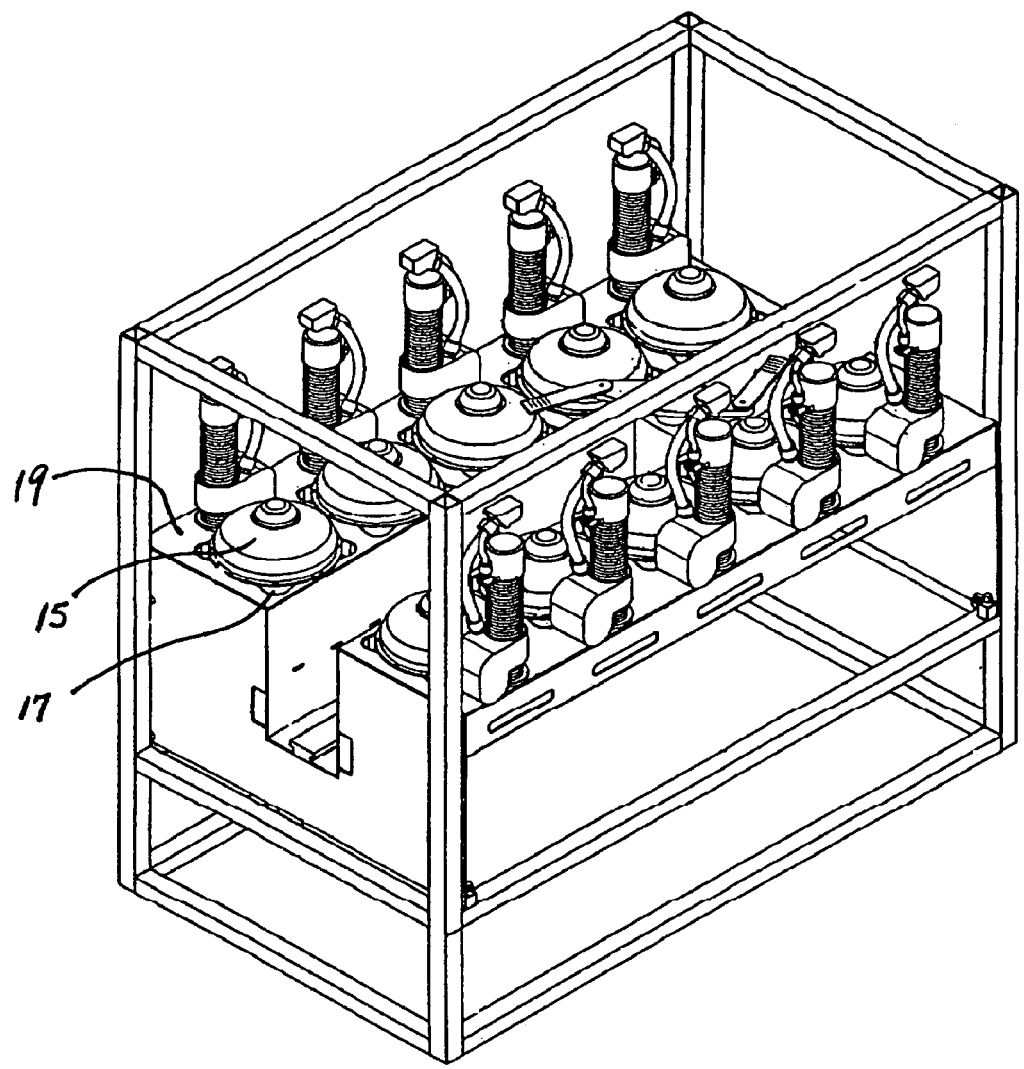
FIG. 1B is an isometric view illustrating a portion of the processing system of FIGS. 1 and 1A in accordance with an embodiment of the invention.

FIG. 1B is an isometric view illustrating a portion of the processing system of FIGS. 1 and 1A. As will be explained below, the invention includes a tiltable rim 24 and a shroud 40. The tiltable rim 24 and the shroud 40 are secured to the deck 19 (see FIG. 1B) of the processing system. Particularly, as may be seen in FIG. 3, the base portion 21 of the shroud 40 is secured to the deck 19.

Figure 2:
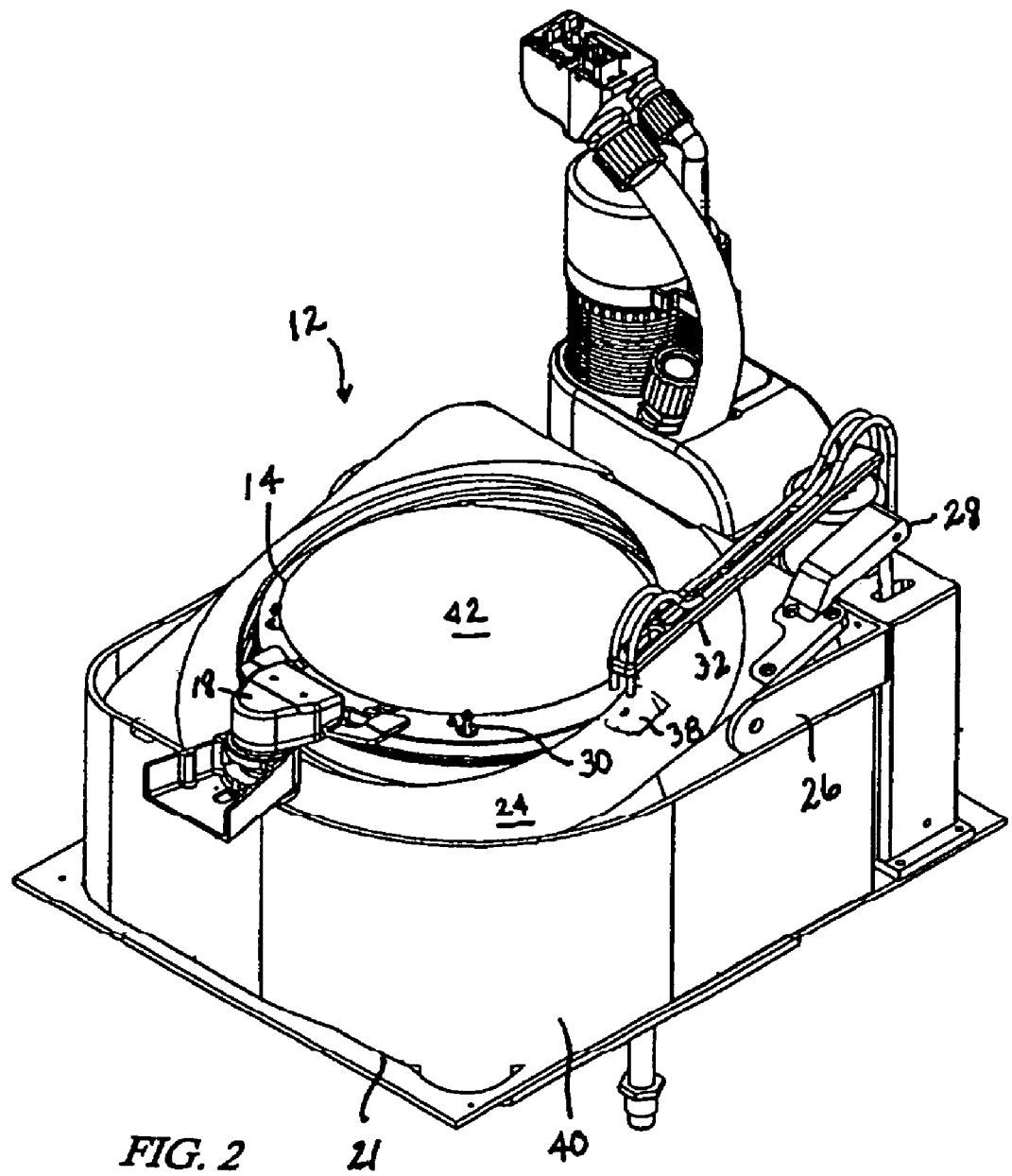
FIG. 2 is a perspective view of the novel process chamber, with the tilting rim in its inclined position, to facilitate either the loading or the unloading of a semi-conductor wafer from the process chamber.

The novel process chamber 12 is shown in perspective in FIG. 2. As noted above, the shroud and the tiltable rim of the novel process chamber 12 of the invention, which may be seen in FIG. 2, may be placed directly above the pre-existing chamber 15 of FIG. 1B, i.e., on the deck 19. This process chamber 12 may be but one of the many different chambers, performing many different functions, typically included in system 10.

Figure 3:
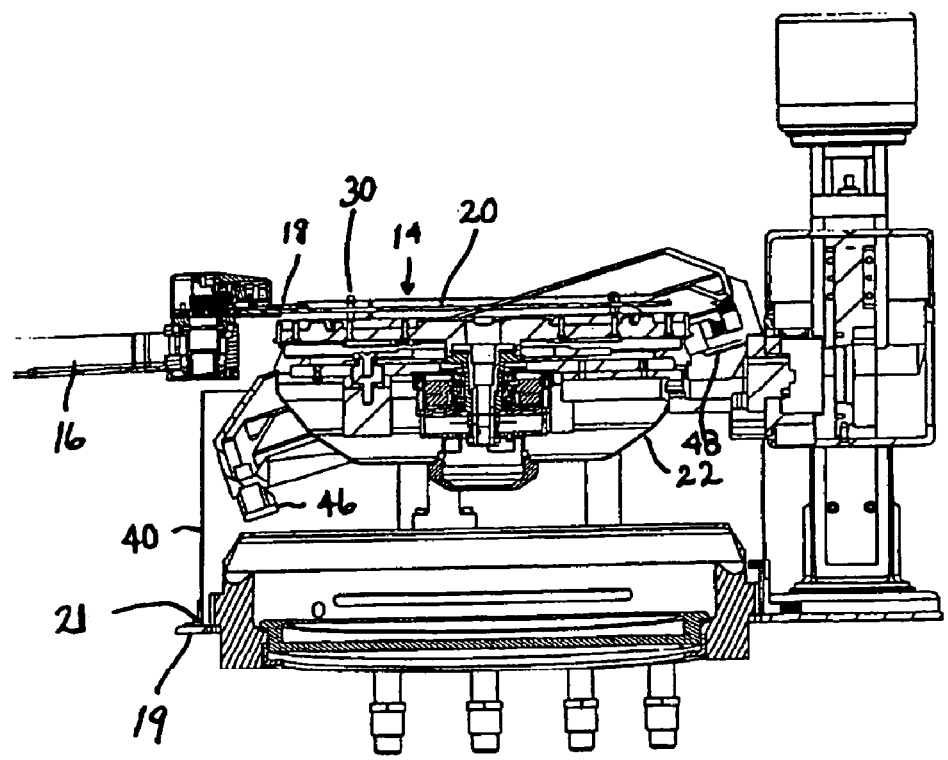
FIG. 3 is a partial sectional view of the process chamber of FIG. 2.

As shown in FIGS. 2 and 3, the novel process chamber 12 of the invention is designed to perform processing steps on a single workpiece, such as a semiconductor wafer 14. The semi-conductor wafer 14 is fed to the process chamber 12 by a robot arm 16 and a robot end effector 18. The robot arm 16 and the robot end effector 18, and their use in connection with the processing of semi-conductor wafers, are both well-known in the art.

The robot arm 16 and robot end effector 18 both place an unfinished wafer 14 onto, and remove a finished wafer 14 from, a rotor 20. In this preferred embodiment, the process chamber 12 includes a single rotor 20. Two or more rotors, however, may also be used.

The rotor 20 is a part of a rotor assembly 22. The rotor assembly 22 receives and carries the wafer 14, positions the wafer 14 for processing, and is capable of rotating or spinning the wafer 14 during processing or drying steps.

In order to permit loading and unloading of the wafer 14, the process chamber includes a tiltable rim 24. This tiltable rim 24 is movable between a non-inclined position (FIG. 4-7) and an inclined position (FIGS. 2 and 3). When the tiltable rim 24 is in its non-inclined position, as shown in FIGS. 4-7, that rim 24 closes an opening that otherwise permits wafers 14 to be loaded into and unloaded from the process chamber 12. Conversely, when the tiltable rim 24 is in its inclined position, as shown in FIGS. 2 and 3, the rim 24 opens a portion of the process chamber 12. When the rim 24 is in this inclined position, the wafers 14 may be loaded into and unloaded from the process chamber 12.

As shown in FIGS. 2 and 3, the tilting of the rim 24 permits access to the rotor 20 by the robot arm 16 and the robot arm effector 18. The tilting of the rim 24 thus permit wafers 14 to be loaded into the process chamber 12, and onto the rotor 20, and subsequently unloaded. Small hook-like fingers 30 arising from the rotor 20 are used to secure the wafer 14 to the rotor 20 during processing of the wafer 14.

The tiltable rim 24 pivots about two pivot points or hinges. One of these hinges 26 is shown in FIG. 2. The other hinge is not shown in FIG. 2. It is secured to the process chamber 12 at a portion of the chamber that is obscured in FIG. 2, on the opposite side of the rim 24. As may be seen by a comparison of FIGS. 2 and 7, the tiltable rim 24 is moved between its inclined and non-inclined position by the actuation of a pneumatic lift arm mechanism 28. Particularly, this pneumatic lift arm mechanism 28 is a double acting pneumatic cylinder with a pivoting clevis mount. Magnetic sensors, available from the vendors of such pneumatic cylinders, are used to indicate the two positions, i.e., the raised and lowered positions, of the cylinder. Both of the positions of the cylinder are defined by mechanical hard stops.

From the above, it will be appreciated that the tiltable rim 24 and its actuating mechanisms are simple in construction, which should result in a more reliable, lower maintenance operation.

Figure 7:
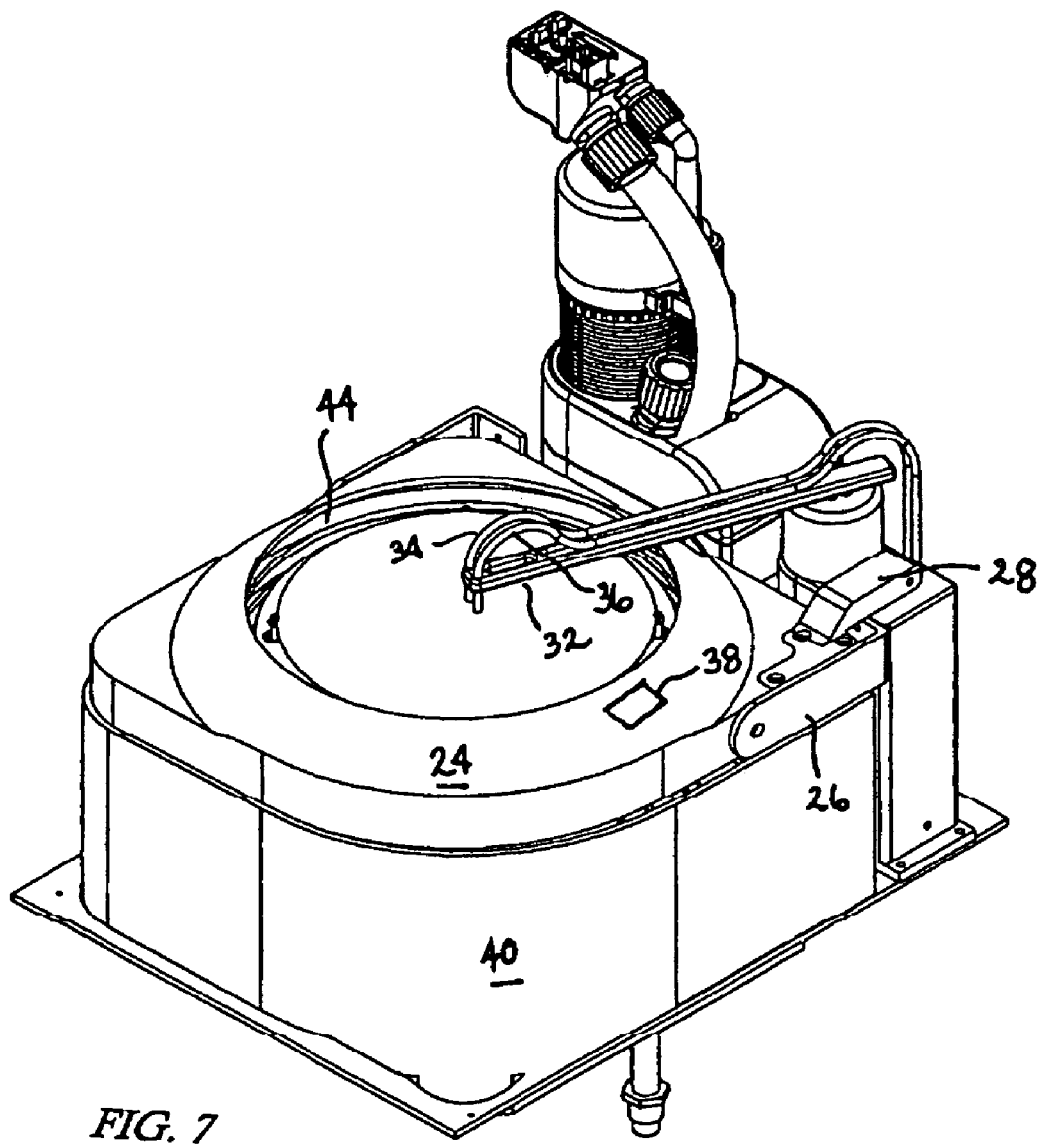
FIG. 7 is a perspective view of the process chamber of FIGS. 2 and 5, but with the rotor and wafer returned to their original positions, and showing a pivoting arm in its first position above the wafer, for delivering processing fluids to the wafer.

The process chamber 12 may also include a pivoting arm or swing arm 32, as may best be seen in FIGS. 2 and 7. The pivoting arm 32 preferably moves in a sweeping motion between two end positions. Its movement is effected by a 50 watt motor and harmonic gear reducer combination. The harmonic gear reduction is 50:1. As with the pneumatic lift arm mechanism 28, the ends of travel of this pivoting or swing arm 32 are defined by hard stops. A home (zero) position is established by registering the pivoting arm 32 against one of the two hard stops. An incremental and absolute encoder on the motor is used to define any other positions, relative to the home position of the pivoting arm 32.

The pivoting arm 32 facilitates the delivery of processing fluids to the wafer 14. In this embodiment, the pivoting arm 32 is movable from a first position to a second position. The first position of the pivoting arm 32 is shown in FIG. 7. In this first position, the pivoting arm is disposed above the wafer 14 for the delivery of those processing fluids to the wafer 14.

As shown in FIG. 7, the pivoting arm 32 includes two tubes 34 and 36. Any gas or liquid can be dispensed through these tubes 34 and 36, depending on the processing needs of the manufacturer.

In one preferred embodiment, tube 36 facilitates the delivery of deionized water to the wafer 14. In contrast, tube 34 facilitates and is dedicated to the delivery to the wafer 14 of either nitrogen alone, or a combination of nitrogen and isopropyl alcohol. Conventional valves (not shown) are used to control the delivery of these gases and liquids to the respective tubes 34 and 36.

The second position of the pivoting arm 32 is shown in FIG. 2. In this second position, the pivoting arm 32 is disposed to the side of the wafer 14, and above the tiltable rim 24. In this second position, the end of the pivoting arm overlies a drip catch tray 38. The drip catch tray 38 collects liquids that drip from either of the two nozzle tips at the ends of the pivoting arm 32. The drip catch tray 38 also collects and facilitates the removal of deionized water, between the conventional valves and the nozzle tips, which occasionally must be purged from tube 32. The drip catch tray 38 is connected to means for transporting these waste liquids to a remote location for disposal. Here, the drip catch tray 38 feeds into channels 44.

The use of a pivoting arm 32 or swing arm in conjunction with the tiltable rim 24 has many beneficial effects. Typically, the pivoting arm moves from a second position to a first position in a sweeping motion, across the face of the spinning wafer 14, so that fluid being discharged from the pivoting arm 32 impinges upon and contacts virtually the entire surface of the wafer 14. The pivoting arm 32 thus permits direct impingement of deionized water onto virtually the entire surface of the spinning wafer 14. Of course, the pivoting arm 32 can also be used to cause impingement of nitrogen, isopropyl alcohol, and any other liquid or gas, onto the entire surface of the wafer 14.

The process chamber 12 can also include an upwardly-disposed shroud 40. As noted above, the shroud 40 is positioned below the tiltable rim 24, but above the deck 19, as shown in FIGS. 1B and 3. The shroud 24 may facilitate higher and more efficient air flow across the perimeter and surface of the first side 42 of the wafer 14. This higher and more efficient air flow may keep particles from remaining on the surface of the wafer 14. In addition, the shroud 40 may assist in keeping within the process chamber 12 the vapors of chemicals used to process the wafer 14. Drying air enters the unit shown in FIGS. 1, 1A and 1B through the HEPA filters 13. It then passes over the wafer 14, and into the top of the shroud 40. Air is discharged from the bottom of the shroud 40, and then continues downward through a portion of the radiused vent openings 17 shown in FIGS. 1 and 1B. The remaining portions of the four radiused vent openings 17 are covered by a flange at the base 21 of the shroud 40.

Figure 5:
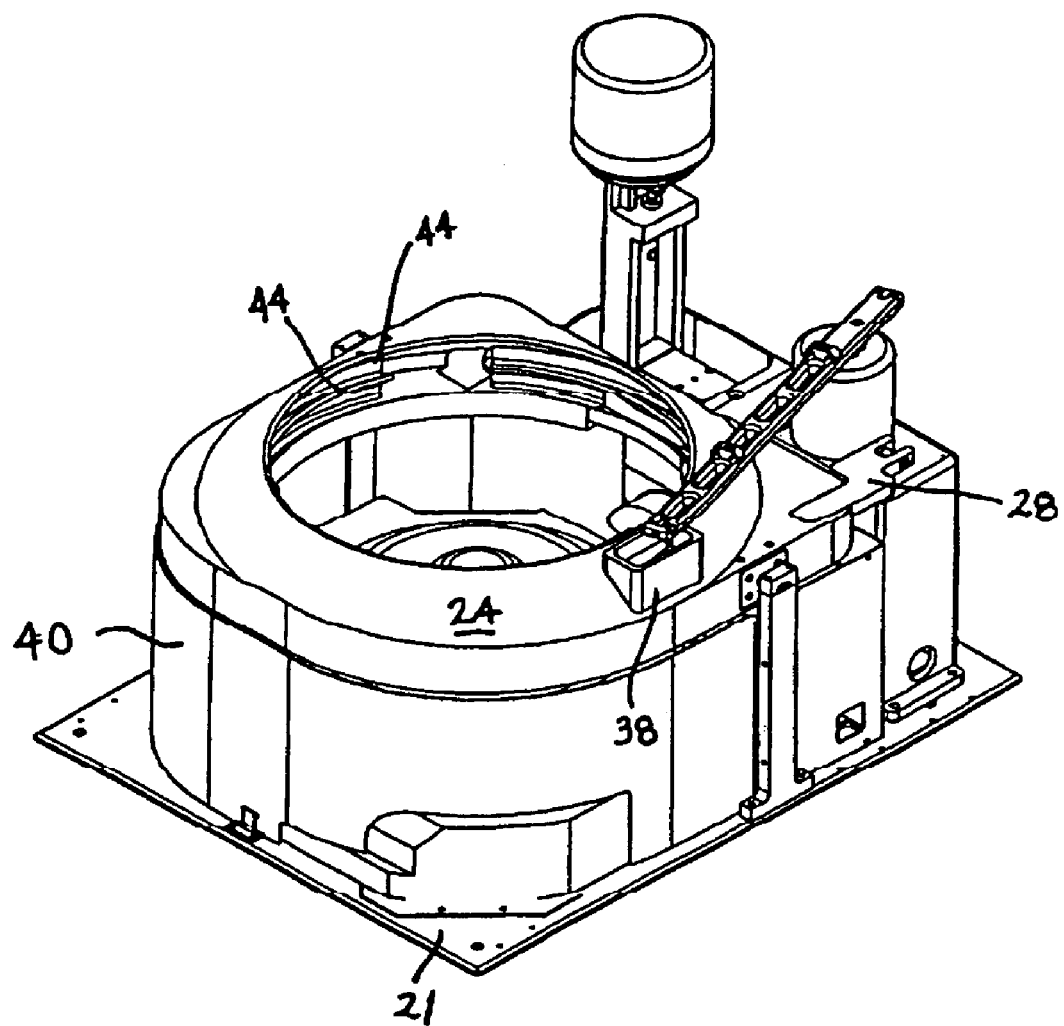
FIG. 5 is a perspective view of the process chamber of FIG. 2, but with both the wafer and the rotor in the lower compartment of the process chamber, and inverted from their orientations as shown in FIG. 2, so that the first side of the wafer faces downwardly.

As shown in FIG. 5, at least one channel 44 is positioned within the tiltable rim 24. A preferred embodiment may include three channels, and two of these three channels 44 are shown in FIG. 5. As a wafer 14 is spun during processing to remove rinse water and dust or dirt from its surface or first side 42, the water and entrained particulates are moved, by centrifugal force, outwardly and towards the rim 24. As the water approaches the rim 24, it enters the channels 44 within the rim 24. Those channels 44 collect and transport the fluid away from the first side 42 of the wafer, and ultimately out of the process chamber 12. In this way, the channels 44 and tiltable rim 24 combine to reduce the likelihood that this fluid will reach the bottom of the process chamber 12.

Much of the fluid collected within the channel 44 is removed from the process chamber 12 through a flexible drain hose fitting 46. This flexible drain hose fitting 46 may best be seen in FIG. 3. Some of the fluid connected within the channel 44 is removed through this hose fitting 46 during the rinsing and spin drying of the wafer 14 by means of the rotor assembly 22. The remainder of the fluid in the channels 44 is discharged during the removal of the treated wafer 14 by the robot end effector 18. Particularly, as the tiltable rim 24 is moved from its non-inclined position to the inclined position, as shown in FIG. 3, any remaining fluid within the channels 44 moves towards the lowest point of the rim 24, i.e., towards the flexible drain hose fitting 46. All fluid that drains out of the flexible drain hose fitting 46 is then discharged to a remote location for disposal.

As discussed above, air is drawn through process chambers, such as process chamber 12, for drying the wafers 14. This drying air enters the process chamber 12 as a result of the generation of vacuum conditions created near the bottom of the process chamber 12. As a result of these vacuum conditions, air is drawn from the ambient above the top of the process chamber 12, over the wafer 14, and down through the bottom of the chamber 12.

Figure 8:
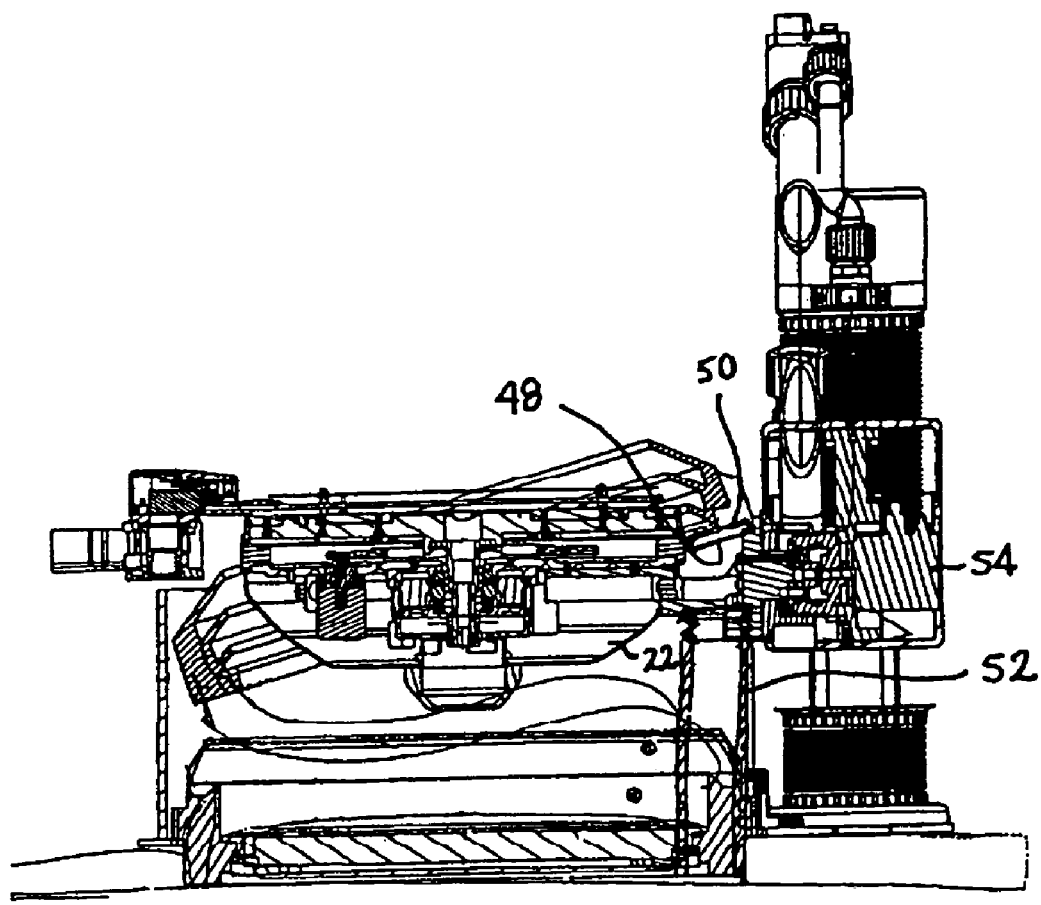
FIG. 8 is a partial sectional view of the process chamber of FIG. 2, but taken along different section lines than those resulting in FIG. 3, and showing the tiltable rim in its inclined position.
Figure 9:
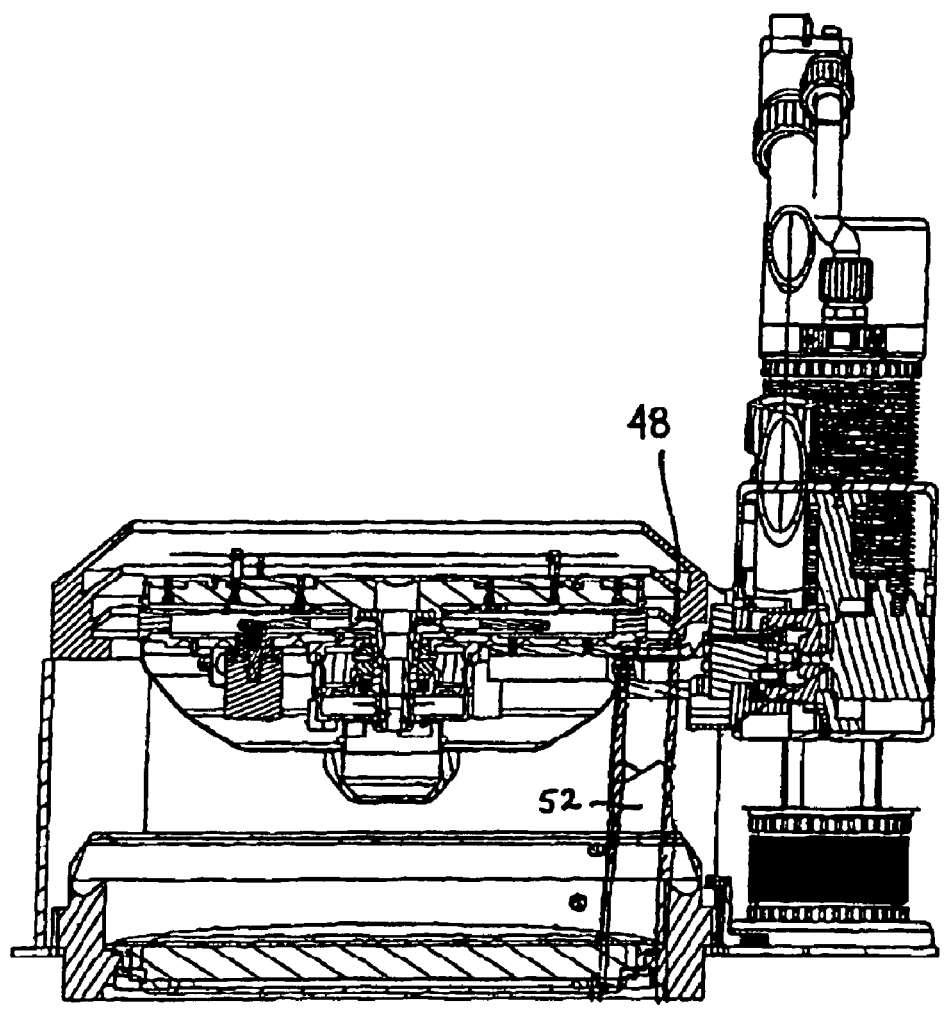
FIG. 9 is a partial sectional view of the process chamber of FIG. 8, but with the tiltable rim in the non-inclined position.
Figure 10:
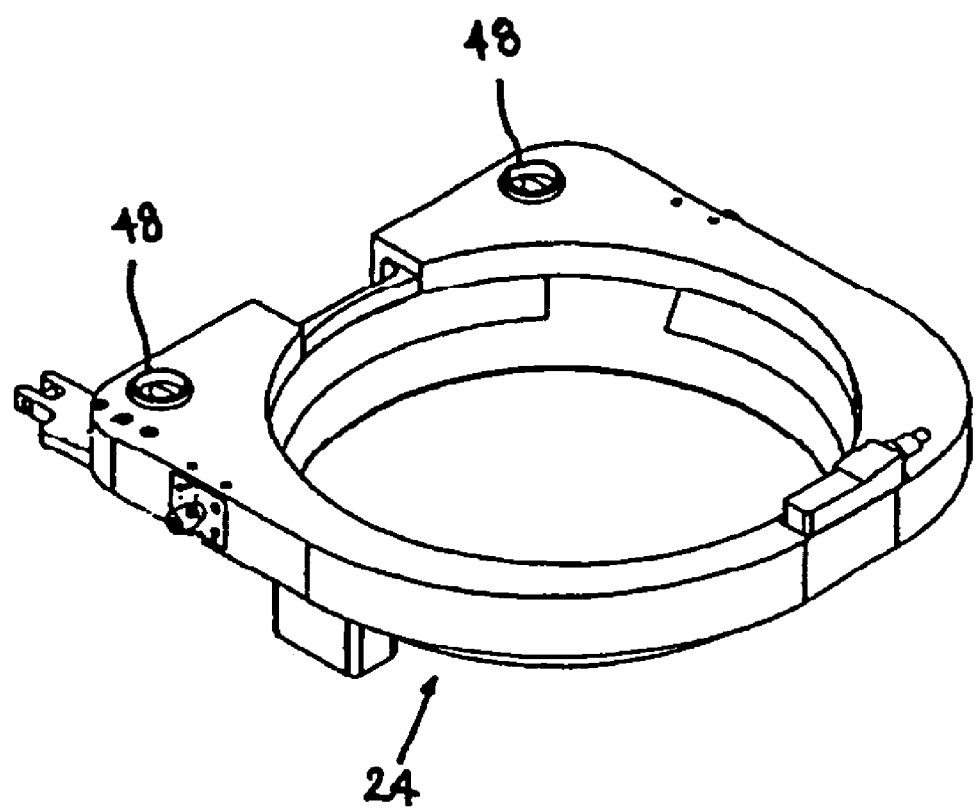
FIG. 10 is an enlarged, perspective view of the underside of the tiltable rim.

Exhaust ports 48 are provided in the tiltable rim 24. Specifically, these exhaust ports 48 are formed within or placed within the tiltable rim 24. One of these exhaust ports 48 is shown in FIGS. 3, 8, and 9, while both exhaust ports 48 are shown in FIG. 10. Each of the exhaust ports 48 include upper ends 50.

FIG. 8 shows the tiltable rim 24 in its inclined position. Nevertheless, as may be appreciated by a review of this FIG. 8, when the tiltable rim 24 is in its non-inclined position, and the rotor assembly 20 and wafer 14 are in the upper compartment of the process chamber 12, as shown in this FIG. 8, the upper ends 50 of these exhaust ports 48 are below the horizontal plane of the wafer 14.

The process chamber also includes a pair of exhaust ducts 52. Each of the exhaust ducts 52 is associated with a single exhaust port 48. One of the exhaust ducts 52, and its associated exhaust port 48, is depicted in FIGS. 8 and 9.

When the tiltable rim 24 is in its inclined position, as shown in FIG. 8, the exhaust port 48 is separated from the exhaust duct 52. In contrast, when the tiltable rim 24 is in its non-inclined position, as shown in FIG. 9, the exhaust port 48 sealingly engages the exhaust duct 52. A portion of the drying air that passes over the wafers 14 may enter the exhaust ports 48, and then enter the exhaust ducts 52 for discharge from the process chamber 12.

During the processing cycle, a relatively small portion of the liquid that is discharged from the pivoting arm 32 for rinsing the wafer 14 may be diverted towards the exhaust ports 48 and exhaust ducts 52. This liquid is entrained in air to form what is essentially an atomized vapor. This atomized vapor leaves the tiltable rim 24 through the exhaust ports 48 and the exhaust ducts 52. The atomized vapor is then carried out of the process chamber 12.

By removing both drying air and liquids from the area near the wafer 14 as it is being processed, the shroud 40, exhaust ports 48, and exhaust ducts 52 together combine to more effectively direct drying air over the wafers 14. In this way, the shroud 40, exhaust ports 48, and exhaust ducts 52 combine to reduce the likelihood that tiny particles of dust, dirt, metals, and manufacturing chemicals will remain upon the surface of the wafers 14 during their processing. This in turn reduces the likelihood that the resulting microelectronic devices will be damaged.

Figure 4:
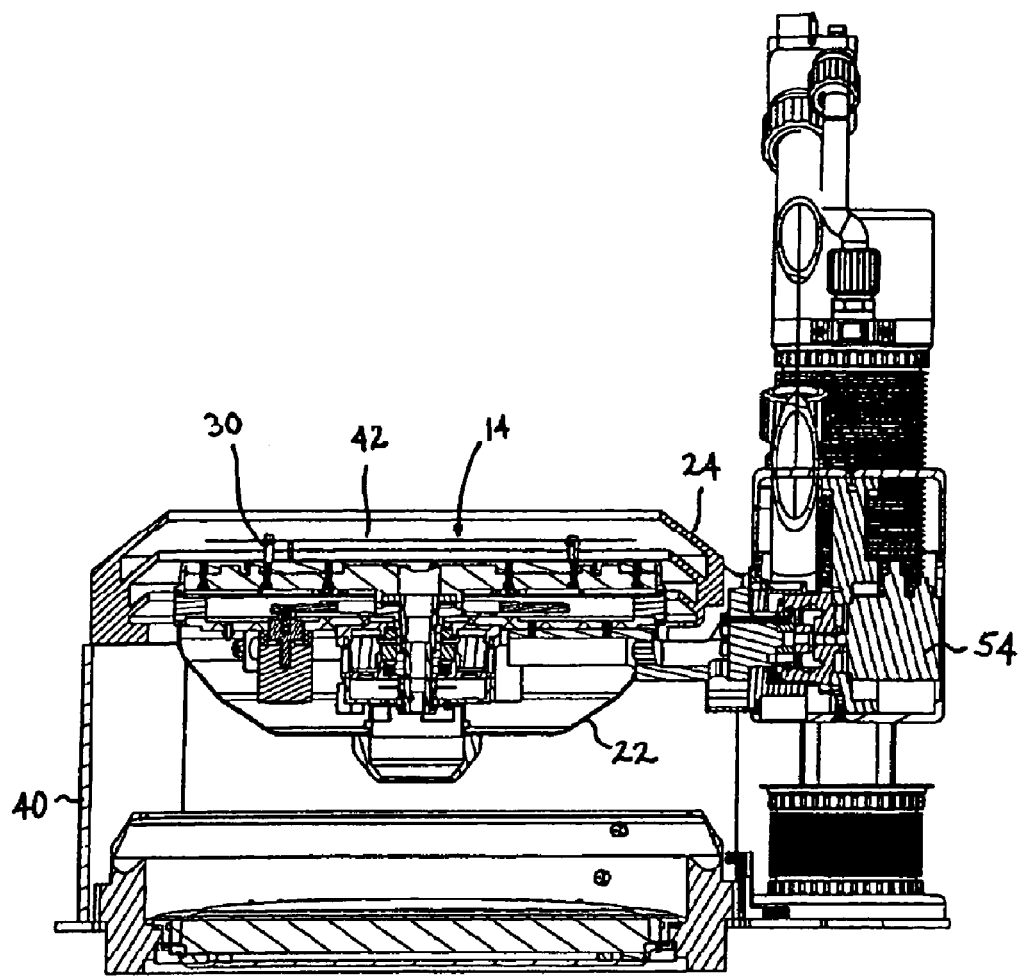
FIG. 4 is a view of the process chamber of FIG. 3, but with the tilting rim in its non-inclined position.
Figure 6:
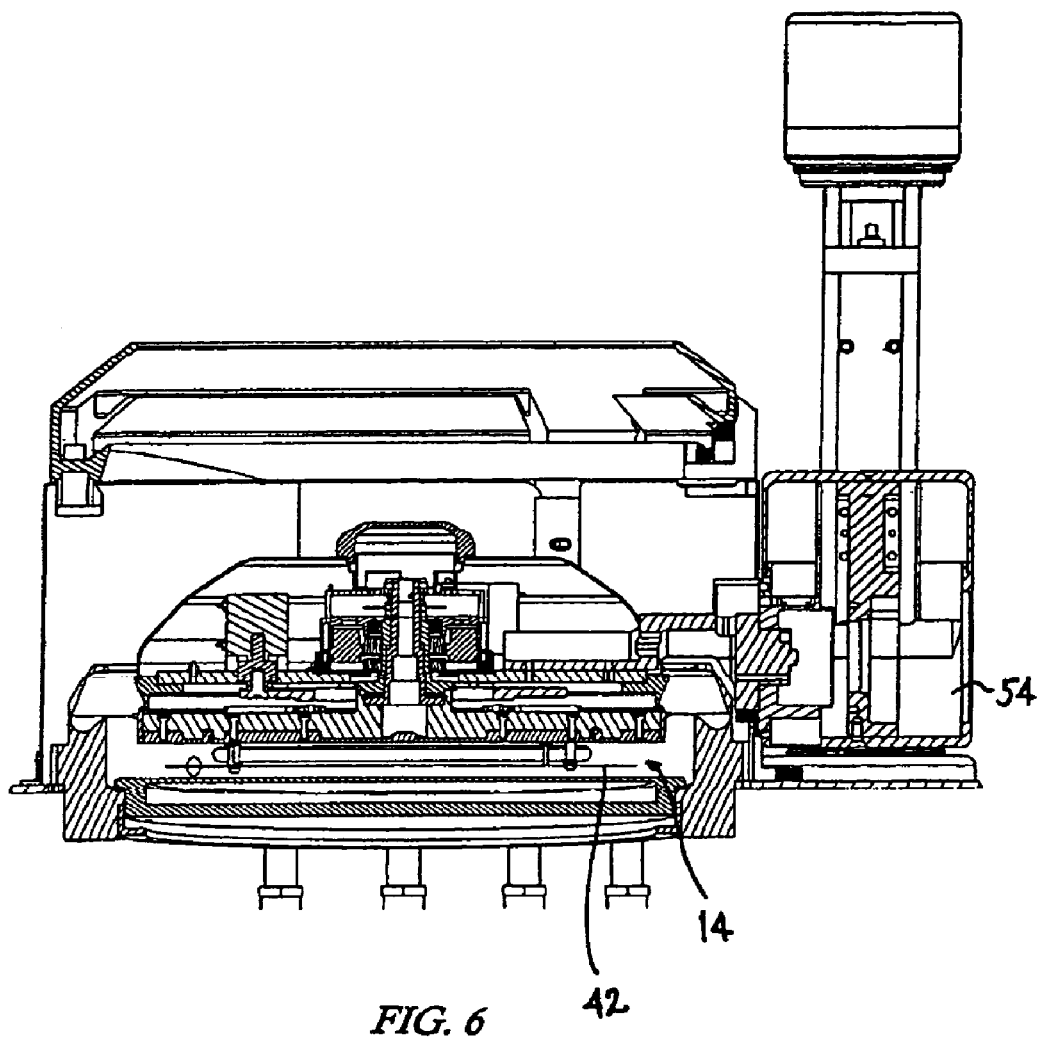
FIG. 6 is a partial sectional view of the process chamber shown in FIG. 5.

The lift/rotate actuator 54 can move the wafer 14 from an upper compartment of the process chamber 12, as shown in FIG. 4; to a lower compartment of the process chamber, as shown in FIG 6.

As it moves the wafer 14 from the upper to the lower compartment of the process chamber 12, the lift/rotate actuator 54 simultaneously inverts the wafer 14 and the rotor 20 on which it is held. Particularly, the lift/rotate actuator 54 moves the wafer 14 from a position in the upper compartment, in which the first side 42 of the wafer 14 faces upwardly, as shown in FIG. 4; to a position in the lower compartment of the process chamber 12, in which that first side 42 of the wafer 14 faces downwardly, as shown in FIG. 6.

In this lower compartment, this downwardly-facing wafer 14 may be subjected to a processing step, as for example through processing with, or by immersion into, a liquid chemical; or processing by treatment with a fluid spray. After the lift/rotate actuator 54 returns the wafer 14 to the compartment of the process chamber 12, and to a position in which the first side 42 again faces upwardly, the processed or treated wafer 14 may be rinsed, dried, and then removed from the process chamber 12.

Accordingly, it is apparent that the invention is also an attachment for removable securement to the deck 19 of a system 10 for processing semiconductor wafers. This attachment includes the tiltable rim 24, which tilts from the non-inclined position to an inclined position. As noted above, this tiltable rim 24 permits the wafers 14 to be loaded into and unloaded from the system 10, when the rim is in its inclined position. The invention also includes a support for securing the tiltable rim 24 to the deck 19. Preferably, this support is a shroud 40.

Recapping the typical process of this invention, using the components described above, the process comprises the treatment of semi-conductor wafers 14 within a process chamber 12. The process includes several steps. First, tiltable rim 24 at the top of the process chamber 12 is tilted from the non-inclined position, as shown in FIGS. 4-7, to the inclined position as shown in FIGS. 2 and 3. The tilting of the rim 24 opens the front of the process chamber 12.

Second, a semiconductor wafer 14 is inserted onto a rotor 20 positioned within the process chamber 12. As may best be seen in FIGS. 2 and 3, the wafer 14 is preferably inserted onto this rotor 20 by means of a robot arm 16 and a robot end effector 18. Upon such insertion, a first side 42 of the wafer 14 is facing upwardly. Upon its initial placement onto the rotor 20, the wafer 14 of FIGS. 2 and 3 is positioned in an upper compartment of the process chamber 12. The tiltable rim 24 is now returned to its non-inclined position, closing the process chamber 12. At this point, the wafer may be subjected to an optional processing step. Next, the wafer 14 and rotor 20 are lowered from this upper compartment of the process chamber 12 to a lower compartment of the process chamber 12. The wafer 14 is shown in the lower compartment of the chamber 12 in FIGS. 5 and 6. As the lift/rotate actuator 54 moves the rotor 20 into the lower compartment of the process chamber 12, it simultaneously inverts the wafer 14. As a result of this inversion, the first side 42 of the wafer 14 faces downwardly.

While the wafer 14 is inverted and disposed within the lower compartment, it may be subjected to another processing step, such as a chemical processing step. After the wafer 14 is processed, the lift/rotate actuator 54 returns the wafer 14 to the upper compartment, and returns the first side 42 of the wafer 14 to its initial position, that is, with its first side 42 facing upwardly. The wafer 14 may then be subjected to yet another processing step, including but not limited to chemical processing, rinsing, and/or drying.

Finally, the tiltable rim 24 is returned to its inclined position. When in this inclined position, as best seen in FIG. 3, any fluid that has been collected within the channel 44 is directed to the flexible drain hose fitting 46, and is thereafter discharged from the process chamber 12. With the rim 24 in this inclined position, the robot arm 16 removes the wafer 14 from the process chamber 12.

The use of a shroud and exhaust ports may increase the retention of chemical vapors within the chamber 12, and may more effectively direct drying air over the wafers 14 used to make microelectronic devices, reducing the likelihood that tiny particles of dust, dirt, metals, and manufacturing chemicals will remain upon the surface of microelectronic devices.

What is claimed is:

1. Processing a workpiece within a process chamber comprising;
    (a) tilting a rim at the top of the process chamber from a non-inclined position to an inclined position, to open the process chamber;
    (b) inserting a workpiece onto a holder positioned within the process chamber with the holder initially holding the workpiece with a first side of the workpiece face-up;
    (c) flipping the workpiece over into a position with the first side of the workpiece face-down;
    (d) processing the workpiece within the process chamber via at least one processing step while the workpiece is in the face-down position; and
    (e) removing the workpiece from the process chamber.

2. The method of claim 1 with the holder comprising a rotor, and further comprising rotating the workpiece on or in the rotor.

3. The method of claim 1 further comprising pivoting an arm from a first position where the arm is above the workpiece to a second position where the arm is off to one side of the workpiece.

4. The method of claim 3 further comprising applying a processing fluid from the arm onto the workpiece.

5. The method of claim 1 further comprising applying vacuum to a collection channel in the rim.

6. The method of claim 1 further comprising making a connection between a collection channel in the rim and an exhaust duct when the rim is in the non-inclined position, and temporarily breaking connection between the collection channel and the exhaust duct, when the rim is in the inclined position.

7. The method of claim 1 further comprising positioning a shroud around a portion of the process chamber below the rim.

8. The method of claim 1 wherein tilting the rim causes a front side of the rim to move down and a back side of the rim to move up, further comprising inserting a wafer into a rotor by moving a robot holding a wafer into a position substantially vertically aligned with the rotor, and with the robot over the front side of the rim.

9. Processing a workpiece within a process chamber, comprising:
    (a) tilting a rim at the top of the process chamber on two hinges secured to the process chamber, from a non-inclined position to an inclined position, to open the process chamber;
    (b) inserting a workpiece onto a holder positioned within the process chamber with the holder initially holding the workpiece with a first side of the workpiece face-up;
    (c) flipping the workpiece over into a position with the first side of the workpiece face-down;
    (d) pivoting an arm from a first position where the arm is above the workpiece to a second position where the arm is off to one side of the workpiece;
    (e) processing the workpiece within the process chamber via at least one processing step with the first side of the workpiece face-down; and
    (f) removing the workpiece from the process chamber.

10. The method of claim 1 with the holder comprising a rotor, and further comprising rotating the workpiece on or in the rotor.

11. The method of claim 1 further comprising applying a processing fluid from the arm onto the workpiece.

12. The method of claim 1 further comprising applying vacuum to a collection channel in the rim.

* * * * *